(12) United States Patent
Iwamoto (10) Patent No.: US 11,289,825 B2
(45) Date of Patent: Mar. 29, 2022

(54) RADIO FREQUENCY MODULE AND METHOD OF MANUFACTURING RADIO FREQUENCY MODULE

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 724 days.

(21) Appl. No.: 16/026,084

(22) Filed: Jul. 3, 2018

(65) Prior Publication Data
US 2018/0316099 A1    Nov. 1, 2018

Related U.S. Application Data

(63) Continuation of application No. PCT/JP2017/001026, filed on Jan. 13, 2017.

(30) Foreign Application Priority Data

Feb. 8, 2016  (JP) .............................. JP2016-021474

(51) Int. Cl.
*H01L 23/498* (2006.01)
*H01Q 23/00* (2006.01)
(Continued)

(52) U.S. Cl.
CPC ....... *H01Q 23/00* (2013.01); *H01L 23/49827* (2013.01); *H01L 23/66* (2013.01);
(Continued)

(58) Field of Classification Search
CPC ........ H01Q 23/00; H01Q 1/2275; H01Q 1/38; H01L 23/49827; H01L 23/66;
(Continued)

(56) References Cited

U.S. PATENT DOCUMENTS 6,154,940 A * 12/2000 Onishi ..................... H03H 3/08
                                                 29/25.35
7,109,068 B2 * 9/2006 Akram .............. H01L 21/76898
                                                 438/128
(Continued)

FOREIGN PATENT DOCUMENTS

JP    2001-196643 A    7/2001
JP    2002-359327 A    12/2002
(Continued)

OTHER PUBLICATIONS

Official Communication issued in International Patent Application No. PCT/JP2017/001026, dated Mar. 28, 2017.

*Primary Examiner* — Dinh T Le
(74) *Attorney, Agent, or Firm* — Keating & Bennett, LLP (57) ABSTRACT

A radio frequency module includes a first electronic component embedded in an insulating layer, a wiring line connected to the first electronic component, and a via conductor extending in a direction perpendicular or substantially perpendicular to a main surface of the insulating layer and including a first portion and a second portion. The first portion of the via conductor is connected to the wiring line. A sectional area of the first portion of the via conductor in a direction parallel or substantially parallel to the main surface of the insulating layer differs from a sectional area of the second portion of the via conductor in the direction parallel or substantially parallel to the main surface of the insulating layer.

20 Claims, 6 Drawing Sheets

(51) Int. Cl.
*H01Q 1/22* (2006.01)
*H01Q 1/38* (2006.01)
*H01L 23/66* (2006.01)
*H03H 9/64* (2006.01)
*H03H 9/05* (2006.01)
*H01L 23/538* (2006.01)

(52) U.S. Cl.
CPC ............. *H01Q 1/2275* (2013.01); *H01Q 1/38* (2013.01); *H03H 9/64* (2013.01); *H01L 23/5389* (2013.01); *H01L 2223/6611* (2013.01); *H03H 9/0547* (2013.01)

(58) Field of Classification Search
CPC ........ H01L 23/5389; H01L 2223/6611; H03H 9/64; H03H 9/0547
See application file for complete search history.

(56) References Cited

U.S. PATENT DOCUMENTS

| | | | |
|---|---|---|---|
| 9,059,058 B2 * | 6/2015 | Teysseyre | H01L 27/14618 |
| 9,202,742 B1 * | 12/2015 | Kim | H01L 23/49838 |
| 9,312,222 B2 * | 4/2016 | Ting | H01L 21/76883 |
| 10,090,256 B2 * | 10/2018 | Liu | H01L 23/49838 |
| 2006/0043570 A1 | 3/2006 | Muramatsu et al. | |
| 2014/0354114 A1 | 12/2014 | Moriya et al. | |
| 2016/0211221 A1 * | 7/2016 | Kim | H01L 23/5389 |
| 2018/0076121 A1 * | 3/2018 | Hsu | H01L 23/49827 |

FOREIGN PATENT DOCUMENTS

| | | |
|---|---|---|
| JP | 2006-066517 A | 3/2006 |
| JP | 2007-281902 A | 10/2007 |
| JP | 2014-236387 A | 12/2014 |
| JP | 2015-103888 A | 6/2015 |

* cited by examiner

RADIO FREQUENCY MODULE AND METHOD OF MANUFACTURING RADIO FREQUENCY MODULE

CROSS REFERENCE TO RELATED APPLICATIONS

This application claims the benefit of priority to Japanese Patent Application No. 2016-021474 filed on Feb. 8, 2016 and is a Continuation Application of PCT Application No. PCT/JP2017/001026 filed on Jan. 13, 2017. The entire contents of each application are hereby incorporated herein by reference.

BACKGROUND OF THE INVENTION

1. Field of the Invention

The present invention relates to a radio frequency module including an electronic component that is embedded in an insulating layer, and a method of manufacturing the radio frequency module.

2. Description of the Related Art

As the size of portable terminals decreases, it is necessary to further decrease the size of electronic components that are mounted thereon and modules that include a combination thereof. Japanese Unexamined Patent Application Publication No. 2002-359327 discloses a circuit board that includes a dielectric substrate that is formed of a conductor layer and an insulating layer that are stacked, a surface acoustic wave element that is included in the dielectric substrate, and an electronic component that is disposed on a surface of the dielectric substrate and that is connected to the surface acoustic wave element. The electronic component and the surface acoustic wave element overlap in the direction of the thickness of the dielectric substrate. This enables the size of the circuit board to be smaller than that in the case in which the electronic component and the surface acoustic wave element are arranged on a plane.

To further decrease the size of a radio frequency module, a space for wiring may be decreased. However, a decrease in the length of a wiring line that extends in a layer direction to decrease the space for wiring requires a conductor that extends through the circuit board in the direction of the thickness of the circuit board to be thinner. This increases an impedance and degrades the radio frequency characteristics of the surface acoustic wave element. It is difficult for known techniques to achieve both a decrease in the space for wiring and good radio frequency characteristics.

SUMMARY OF THE INVENTION

Preferred embodiments of the present invention provide radio frequency modules that are decreased in size and that have an increased degree of freedom of a wiring layout and good radio frequency characteristics, and methods of manufacturing the radio frequency modules.

A radio frequency module according to a preferred embodiment of the present invention includes a first electronic component that is embedded in an insulating layer, a wiring line that is connected to the first electronic component, and a via conductor that extends in a direction perpendicular or substantially perpendicular to a main surface of the insulating layer and that includes at least a first portion and a second portion. The first portion of the via conductor is connected to the wiring line. A sectional area of the first portion of the via conductor in a direction parallel or substantially parallel to the main surface of the insulating layer differs from a sectional area of the second portion of the via conductor in the direction parallel or substantially parallel to the main surface of the insulating layer. In the present disclosure, the "direction perpendicular or substantially perpendicular" is not limited to a perpendicular direction and may be inclined at about ±10 degrees from the perpendicular direction, and the "direction parallel or substantially parallel" is not limited to a parallel direction and may be inclined at about ±10 degrees from the parallel direction, for example.

In a radio frequency module according to a preferred embodiment of the present invention, the sectional area of the first portion of the via conductor in the direction parallel or substantially parallel to the main surface of the insulating layer is smaller than the sectional area of the second portion of the via conductor in the direction parallel or substantially parallel to the main surface of the insulating layer.

In a radio frequency module according to a preferred embodiment of the present invention, the first electronic component is a surface acoustic wave filter.

In a radio frequency module according to a preferred embodiment of the present invention, the insulating layer is made of a resin.

In a radio frequency module according to a preferred embodiment of the present invention, the radio frequency module further includes a second electronic component that is electrically connected to the first electronic component, and at least a portion of the first electronic component overlaps the second electronic component in a plan view.

In a radio frequency module according to a preferred embodiment of the present invention, a dimension of the first portion of the via conductor in the direction perpendicular or substantially perpendicular to the main surface of the insulating layer is shorter than a dimension of the second portion of the via conductor in the direction perpendicular or substantially perpendicular to the main surface of the insulating layer.

In a radio frequency module according to a preferred embodiment of the present invention, a center of gravity of the first portion of the via conductor is nearer than a center of gravity of the second portion of the via conductor to the first electronic component. The "center of gravity of the first portion of the via conductor being nearer than the center of gravity of the second portion of the via conductor to the first electronic component" means that, when the center of gravity of the first portion of the via conductor and the center of gravity of the second portion are projected in the direction perpendicular or substantially perpendicular to the main surface of the insulating layer on a plane, the projected center of gravity of the first portion is nearer than the projected center of gravity of the second portion to a functional electrode of the first electronic component.

A method of manufacturing a radio frequency module that includes an electronic component that is embedded in the insulating layer according to a preferred embodiment of the present invention includes forming a first cavity, forming a second cavity that has a volume different from a volume of the first cavity and that is connected to the first cavity, forming a via conductor in the first cavity and the second cavity, forming an insulator such that the via conductor and the electronic component are embedded in the insulator, and forming a wiring line that connects the via conductor and the electronic component to each other.

In a method of manufacturing a radio frequency module according to a preferred embodiment of the present invention, the via conductor includes Cu and is formed by an electroplating method.

In radio frequency modules according to preferred embodiments of the present invention, the via conductor that is provided in the insulating layer includes portions having different sectional areas, and accordingly, the length of the wiring line in a wiring layer of the electronic component is able to be decreased. Consequently, good radio frequency characteristics are able to be achieved, the degree of freedom of a wiring layout is able to be increased, and the size of the radio frequency module is able to be decreased. Specifically, when the electronic component is a filter device, isolation characteristics are improved, and an insertion loss is decreased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Radio frequency modules according to preferred embodiments of the present invention will hereinafter be described by way of example. A surface acoustic wave filter (SAW filter) is described as an example of an electronic component. The present invention, however, is not limited to the preferred embodiments described below. The drawings make preferred embodiments of the present invention easy to understand, and the reduced scale of each drawing differs from the actual scale.

Figure 1:
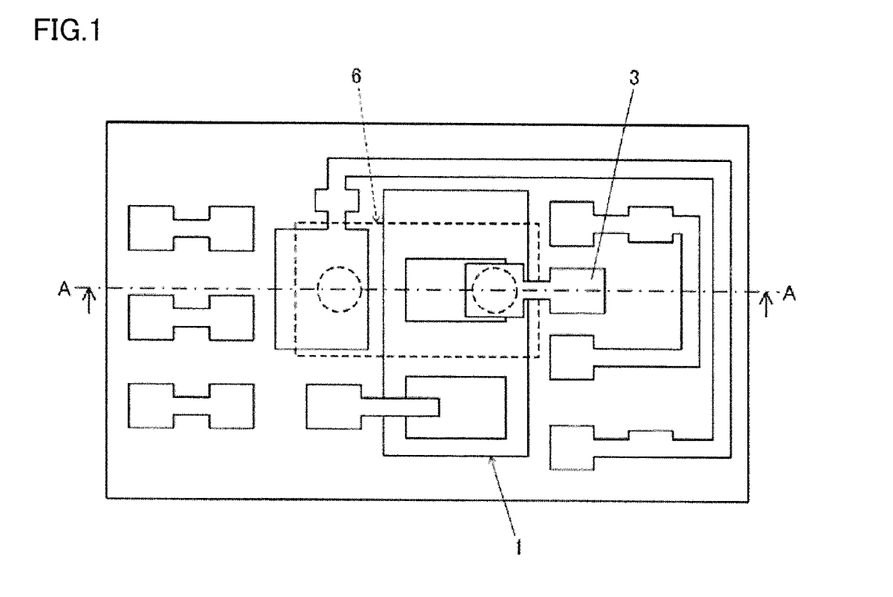
FIG. 1 is a schematic plan view of a wiring layer of a radio frequency module according to a preferred embodiment of the present invention.

A radio frequency module according to a preferred embodiment of the present invention will be described with reference to FIG. 1 and FIG. 2. FIG. 1 is a schematic plan view of a wiring layer of a radio frequency module according to a preferred embodiment of the present invention. Wiring lines are pulled around a surface acoustic wave filter 1 and connected to the surface acoustic wave filter 1 and the other electronic component.

Figure 2:
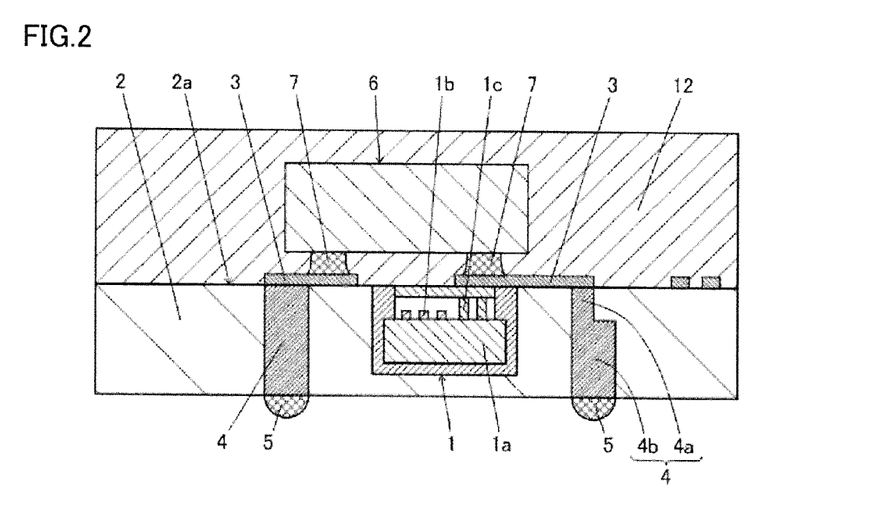
FIG. 2 is a schematic sectional view of a portion of a radio frequency module according to a preferred embodiment of the present invention.

FIG. 2 is a schematic sectional view of the radio frequency module according to the present preferred embodiment of the present invention and illustrates a section taken along line A-A in FIG. 1. The surface acoustic wave filter includes a piezoelectric substrate 1a. Element electrodes, such as interdigital transducer electrodes 1b and a functional electrode 1c, are disposed on one main surface of the piezoelectric substrate 1a. The other main surface and both side surfaces are covered with a resin protective layer.

The surface acoustic wave filter 1 is embedded in an insulating layer 2 to decrease the size and height of the module. The insulating layer 2 covers the side surfaces of the piezoelectric substrate 1a of the surface acoustic wave filter 1 and the main surface thereof on which the interdigital transducer electrodes 1b are not provided, and accordingly, airtightness and humidity resistance are improved.

On both sides of the surface acoustic wave filter 1 in the insulating layer 2, via conductors 4 extend in the direction perpendicular or substantially perpendicular to a main surface 2a thereof. One of the via conductors 4 includes a first portion 4a and a second portion 4b. An end portion of the first portion 4a of the via conductor 4 is connected to a corresponding one of wiring lines 3. The wiring line 3 is electronically connected to the functional electrode 1c of the surface acoustic wave filter 1. One of the bump electrodes 5 is provided on an end portion of the second portion 4b of the via conductor 4. Connecting the bump electrodes 5 to a circuit board (not illustrated) enables surface mounting of the radio frequency module on the circuit board.

The one of the via conductors 4 preferably has a step shape. The sectional area of the first portion 4a in the direction parallel or substantially parallel to the main surface 2a of the insulating layer 2 differs from the sectional area of the second portion 4b. More specifically, the sectional area of the first portion 4a of the via conductor 4 is decreased such that the length of the corresponding wiring line 3 is shorter than in the case in which the via conductor 4 has a uniform sectional area that is the same or substantially the same as that of the second portion 4b. This creates a new wiring space, increases the degree of freedom of the wiring layout of the wiring layer, and decreases the size of the module. In addition, the impedance of the wiring line 3 decreases. Accordingly, isolation characteristics of the surface acoustic wave filter 1 are improved, and an insertion loss is decreased.

Since the sectional area of the first portion 4a of the via conductor 4 is smaller than the sectional area of the second portion 4b, the impedance of the via conductor 4 is larger than in the case in which the via conductor 4 has a uniform sectional area that is the same or substantially the same as that of the second portion 4b. In view of this, the dimension of the first portion 4a of the via conductor 4 in the direction perpendicular or substantially perpendicular to the main surface 2a of the insulating layer 2 is determined to differ from the dimension of the second portion 4b of the via conductor 4 in the direction perpendicular or substantially perpendicular to the main surface 2a of the insulating layer 2. This enables the impedance of the via conductor 4 to be adjusted. Thus, the wiring space is able to be narrow, and good radio frequency characteristics are able to be achieved. In consideration for the impedance of the via conductor 4 and the wiring line 3 in this manner, the optimum shape and dimension of the via conductor and the length of the wiring line is able to be determined.

An electronic component 6 may be mounted in a region of a plane on which a region around the surface acoustic wave filter 1 is projected in the direction perpendicular or substantially perpendicular to the main surface 2a of the insulating layer 2. That is, a portion of the surface acoustic wave filter 1 overlaps the electronic component 6 in a plan view. The electronic component 6 is mounted so as to be electrically connected to the surface acoustic wave filter 1 with one of electrode pads 7 and one of the wiring lines 3 interposed therebetween. This structure enables the length of the wiring line to be shorter than in the case in which the surface acoustic wave filter 1 and the electronic component 6 are arranged on a plane, and enables the size of the module to be decreased.

After the electronic component 6 is mounted, the module is sealed with an insulating layer 12. The module that is sealed with the insulating layer 12, which is made of resin, for example, improves heat resistance and waterproof properties.

According to the present preferred embodiment, the surface acoustic wave filter is described as an example of the electronic component that is embedded in the insulating layer. However, a boundary acoustic wave filter, a bulk acoustic wave filter, a Lamb wave filter, or MEMS (Micro Electro Mechanical Systems) may be used. Examples of the electronic component that may be mounted in the projected region in the layer direction include various filter devices, a switch, a chip inductor, a chip capacitor, a power amplifier, and an IC (Integrated Circuit), for example.

Figure 3A:
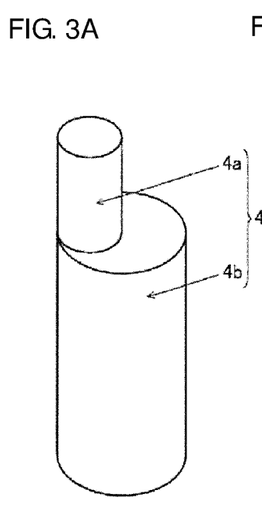
FIGS. 3A to 3E illustrate modifications to a via conductor 4 in FIG. 2.
Figure 3B:
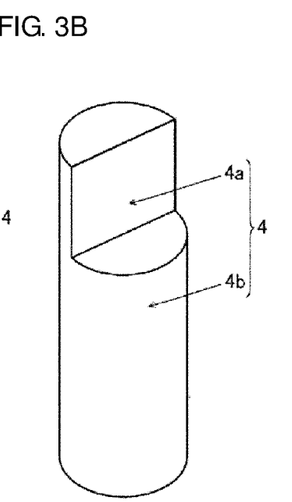
Figure 3C:
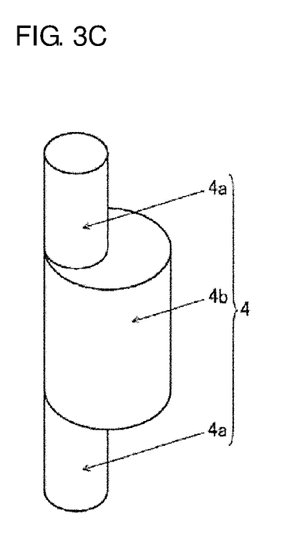
Figure 3D:
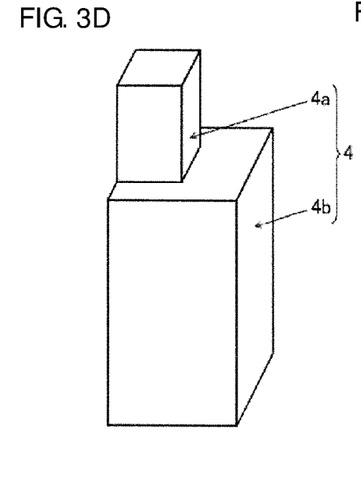
Figure 3E:
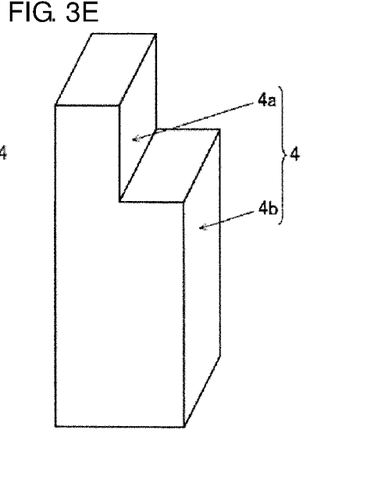

The shape of the first portion 4a and the second portion 4b of the via conductor 4 are not particularly limited and may be, for example, a shape that is surrounded by a curved line, such as a circular or substantially circular shape or an elliptical or substantially elliptical shape or a polygonal shape, such as a rectangular or substantially rectangular shape as illustrated in FIGS. 3A to 3E. As illustrated in FIG. 3C, the via conductor 4 may include three or more portions that have different shapes, for example. In this case, the length of the corresponding wiring line 3 is able to be decreased, the size of the corresponding bump electrode 5 to be mounted on the circuit board is able to be decreased, and a new wiring space is able to be provided on the circuit board. This increases the degree of freedom of the wiring layout of the wiring layer and the circuit board, enables the wiring space to be narrow, and enables the size of the module to be decreased.

The position at which the first portion 4a and the second portion 4b of the via conductor 4 are connected to each other is not particularly limited. According to the present preferred embodiment, to decrease the length of the corresponding wiring line 3, the first portion 4a of the via conductor 4 is located near the functional electrode 1c of the surface acoustic wave filter 1.

According to the present preferred embodiment, one of the via conductors 4 includes the first portion 4a and the second portion 4b. This structure enables the wiring space to be narrow at a certain location and enables good radio frequency characteristics to be achieved.

Examples of the materials of the wiring lines 3, the via conductors 4, and the bump electrodes 5 preferably include a metal such as Cu, Al, Pt, Au, Ti, Ni, Cr, Co, and Mn, a multilayer body made of the metal, and an alloy thereof. The materials of the first portion 4a and the second portion 4b of the via conductor 4 may differ from each other in consideration of, for example, adhesion to an object to be connected and electric power handling capability.

The terms "wiring line" and "functional electrode" do not limit the structure thereof. For example, the wiring line 3 that is connected to the functional electrode 1c of the surface acoustic wave filter 1 and the functional electrode 1c of the surface acoustic wave filter may be integrally provided.

The insulating layer may preferably be made of a thermosetting resin that includes at least one selected from the group consisting of an epoxy resin, a silicon resin, polyimide, and polyamide, for example. According to the present preferred embodiment, the insulating layer is preferably a single layer. The insulating layer, however, is not limited thereto and may be a multilayer body that includes insulating layers.

A non-limiting example of a method of manufacturing the radio frequency module according to a preferred embodiment of the present invention will be described with reference to FIGS. 4A to 4D to FIGS. 7A to 7C. The manufacturing method includes forming a first cavity, forming a second cavity that has a volume different from the volume of the first cavity and that is connected to the first cavity, forming a via conductor in the first cavity and the second cavity, forming an insulator such that the via conductor and an electronic component are embedded in the insulator, and forming a wiring line that connects the via conductor and the electronic component to each other. The phrase "to be embedded" means that at least the side surfaces of the electronic component are covered by the insulating layer, and the main surfaces or a portion of each main surface of the electronic component may be exposed from the insulating layer.

Figure 4A:
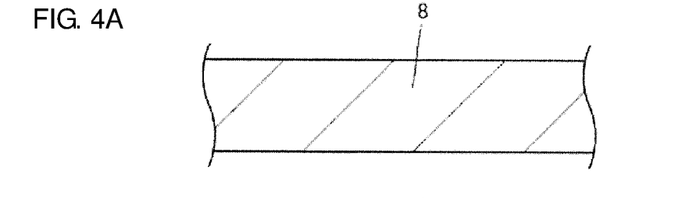
FIGS. 4A to 4D illustrate a portion of a manufacturing process of a radio frequency module according to a preferred embodiment of the present invention with sectional views.
Figure 4B:
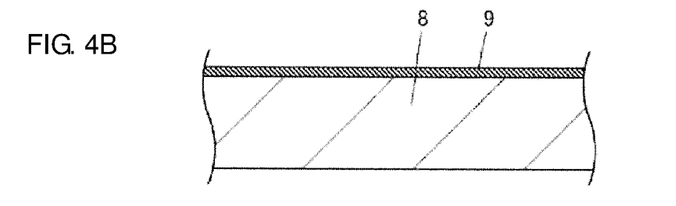

FIGS. 4A to 4D and FIGS. 5A to 5C illustrate a series of processes of forming the via conductors 4 during the manufacturing process of the radio frequency module according to the present preferred embodiment with sectional views. As illustrated in FIGS. 4A and 4B, a metallic seed layer 9 is formed on one main surface of a support 8 by, for example, a sputtering method or a vapor deposition method. The seed layer 9 is used as a power supply film in a subsequent electroplating process.

Figure 4C:
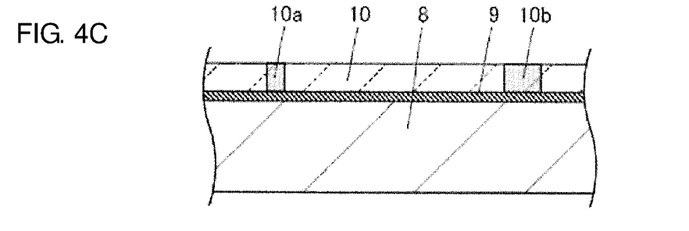

Subsequently, as illustrated in FIG. 4C, a film resist 10 is attached to the seed layer 9 by a roll laminating method. Subsequently, the film resist 10 is patterned by a photolithography process such that a cavity 10a and a cavity 10b are formed at predetermined positions.

Figure 4D:
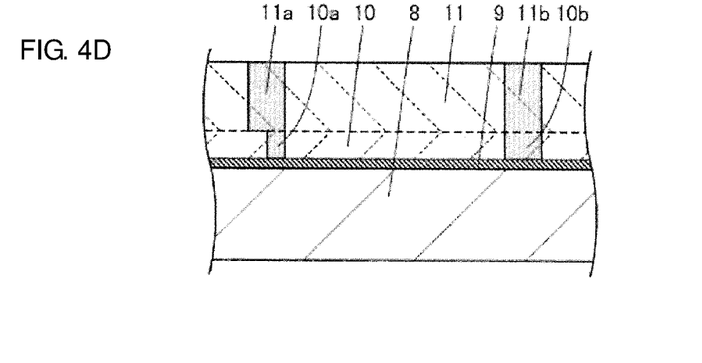
Figure 5A:
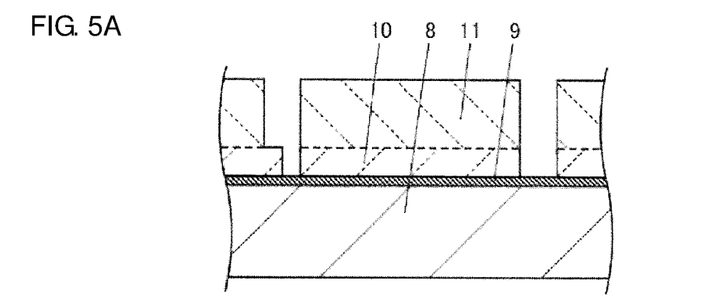
FIGS. 5A to 5C illustrate a portion of a manufacturing process of a radio frequency module according to a preferred embodiment of the present invention with sectional views.

Subsequently, as illustrated in FIG. 4D, a film resist 11 is superposed on and attached to the patterned film resist 10. Subsequently, the film resist 11 is patterned by a photolithography process such that a cavity 11a and a cavity 11b are formed at predetermined positions. At this time, the patterning is performed such that the cavity 10a and the cavity 11a are connected to each other and the cavity 10b and the cavity 11b are connected to each other in the direction in which the film resists are stacked. Subsequently, the film resists are immersed into a developing solution and melted in accordance with the patterns, and cavities as illustrated in FIG. 5A are formed.

The patterning is preferably performed such that, for example, the diameter of the cavity 10a is about 30 μm, and the diameter of the cavity 11a is about 120 μm, that is, the diameters differ from each other. This enables one of the via conductors that has a shape of a step to be formed in a subsequent process and enables the sectional area of the first portion 4a in the direction parallel or substantially parallel to the main surface of the insulating layer differs from the sectional area of the second portion 4b. The patterning is preferably performed such that the diameters of the cavity 10b and the cavity 11b are about 100 μm, for example.

The use of the film resists having different thicknesses enables cavities having different volumes to be formed. The film resist 10 preferably has a thickness of about 50 μm, for example. The film resist 11 preferably has a thickness of about 150 μm, for example. The cavity 10a is formed near the surface acoustic wave filter that is to be formed in a subsequent process.

Figure 5B:
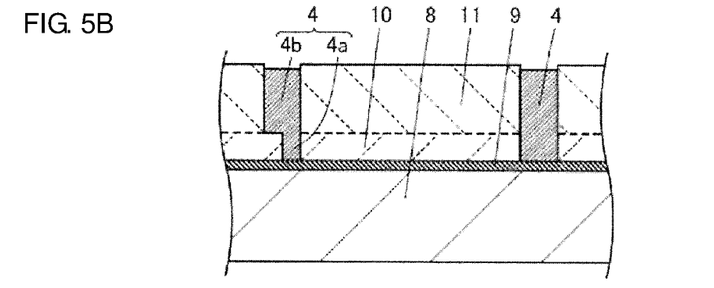
Figure 5C:
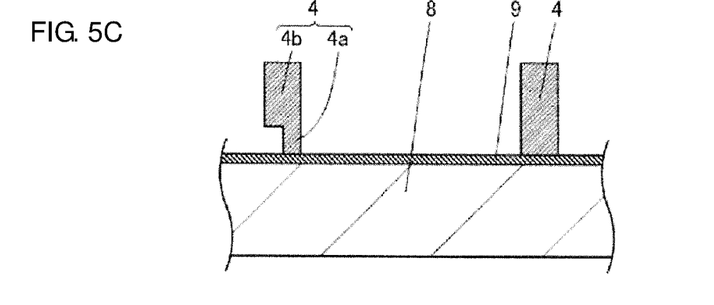

Subsequently, as illustrated in FIG. 5B, oxide films are removed by being immersed in a solvent that includes diluted sulfuric acid, and the cavities are filled with Cu by an electroplating method, for example. Subsequently, the film resists are separated by being immersed in a solvent that includes N-methylpyrrolidone, for example. As illustrated in FIG. 5C, one of the via conductors 4 that are formed includes the first portion 4a and the second portion 4b that have shapes following the shapes of the cavities.

Figure 6A:
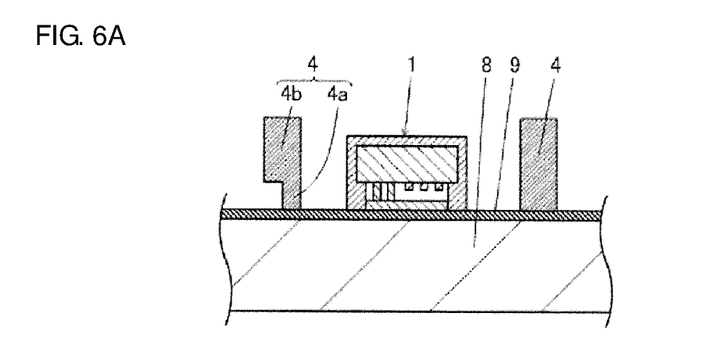
FIGS. 6A to 6D illustrate a portion of a manufacturing process of a radio frequency module according to a preferred embodiment of the present invention with sectional views.

FIGS. 6A to 6D and FIGS. 7A to 7C illustrate a series of processes of embedding the surface acoustic wave filter 1 in the insulating layer 2 and mounting the electronic component 6 during the manufacturing process of the radio frequency module according to the present preferred embodiment with sectional views. An adhesive is first applied. As illustrated in FIG. 6A, the surface acoustic wave filter 1 is disposed between the via conductors 4 such that the main surface on which the functional electrode 1c is formed faces the support.

Figure 6B:
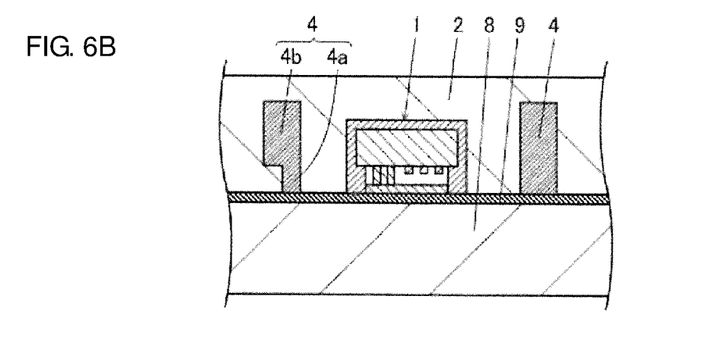
Figure 6C:
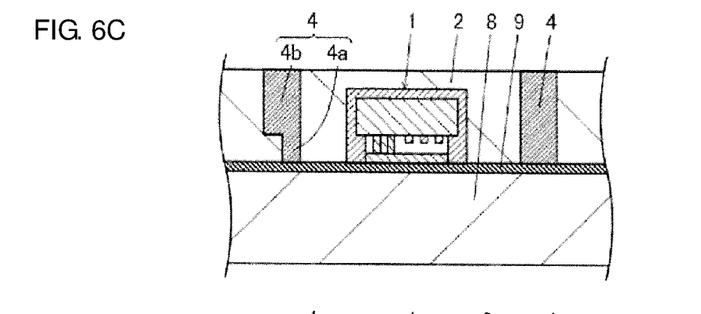

Subsequently, as illustrated in FIG. 6B, the insulating layer 2 is formed of a thermosetting epoxy resin such that the surface acoustic wave filter 1 and the via conductors 4 are embedded therein. Subsequently, as illustrated in FIG. 6C, the insulating layer 2 is ground to expose one end portion of each via conductor 4.

Figure 6D:
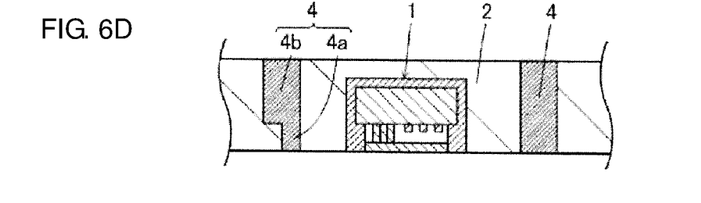
Figure 7A:
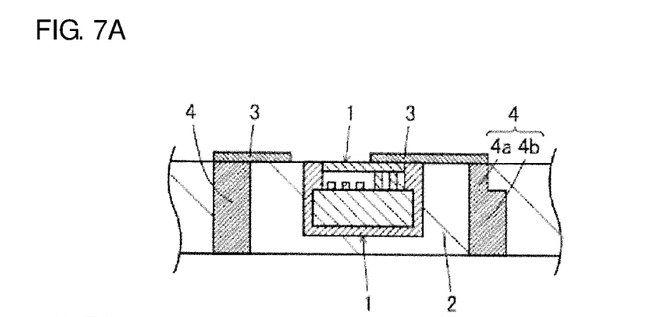
FIGS. 7A to 7C illustrate a portion of a manufacturing process of a radio frequency module according to a preferred embodiment of the present invention with sectional views.

Subsequently, as illustrated in FIG. 6D, the support 8, the seed layer 9, and the adhesive are removed to expose the functional electrode 1c of the surface acoustic wave filter 1 and the other end portion of each via conductor 4. Subsequently, as illustrated in FIG. 7A, the wiring line 3 that connects the one end portion of one of the via conductors 4 and the functional electrode 1c of the surface acoustic wave filter 1 to each other is formed by a semi-additive method with photolithography. Consequently, the radio frequency module that includes the surface acoustic wave filter 1 that is embedded in the insulating layer 2 is formed.

Figure 7B:
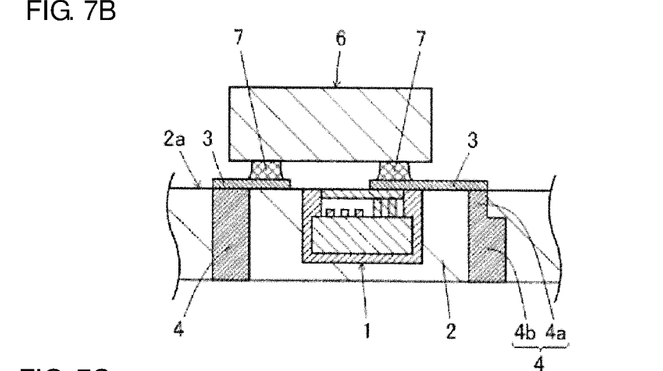
Figure 7C:
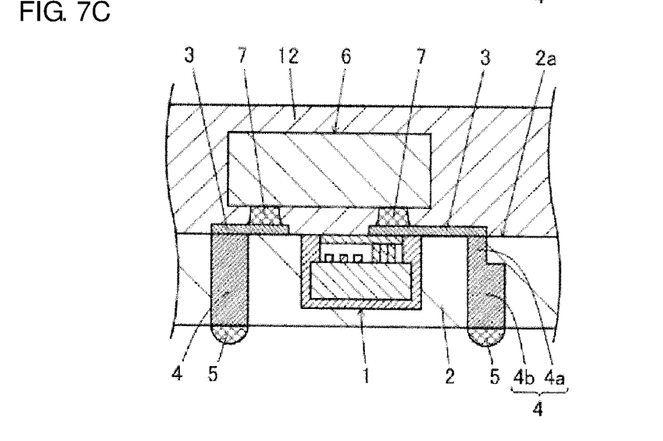

As illustrated in FIG. 7B, the electronic component 6 may be mounted on the electrode pads 7 in a region of a plane on which a region around the surface acoustic wave filter 1 is projected in the direction perpendicular or substantially perpendicular to the main surface 2a of the insulating layer 2. As illustrated in FIG. 7C, after the electronic component 6 is mounted, the module may be sealed with the insulating layer 12. The bump electrodes 5 to be surface mounted on the circuit board may be formed on the other end portions of the via conductors 4 that are exposed.

According to the present preferred embodiment, the via conductors 4 are preferably formed by the electroplating method at one time. The electroplating method may be divided into multiple processes. In this case, the film resist 10 is patterned and immersed in the developing solution to form the cavity 10a and the cavity 10b, and the cavity 10a and the cavity 10b are filled with Cu by the electroplating method. Subsequently, the film resist 11 is superposed on and attached to the film resist 10 and is patterned such that the cavities are to be connected to each other in the direction in which the film resists are stacked, and the cavity 11a and the cavity 11b that are formed by the immersion in the developing solution are filled with Cu by the electroplating method. Consequently, the via conductor that includes the first portion 4a and the second portion 4b that have shapes following the shapes of the cavities is formed.

The present invention is not limited to the above-described preferred embodiments. Various applications may be conceived, and various modifications may be made without departing from the concept of the present invention. The above-described preferred embodiments are described by way of example. It is noted that features of different preferred embodiments may be partially replaced or combined.

Preferred embodiments of the present invention are described above. All aspects of the preferred embodiments in the disclosure are described by way of example and are not restrictive. The scope of the present invention is shown by the scope of claims and includes all modifications having the same content and range as the scope of claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A radio frequency module comprising:
an insulating layer;
a first electronic component that is embedded in the insulating layer;
a wiring line that is electrically connected to the first electronic component and that is provided on one main surface of the insulating layer;
a bump electrode that is provided on another main surface of the insulating layer that is opposite to the one main surface of the insulating layer; and
a via conductor that extends through the insulating layer and that is connected to the wiring line and the bump electrode; wherein
the via conductor includes a first portion on a wiring line side and a second portion on a bump electrode side;
a sectional area of the first portion in a direction parallel or substantially parallel to the one main surface differs from a sectional area of the second portion in the direction parallel or substantially parallel to the one main surface;
the first portion is provided at the one main surface; and
a center axis of the first portion that extends in a direction in which the via conductor extends through the insulating layer is offset from a center axis of the second portion that extends in the direction in which the via conductor extends.

2. The radio frequency module according to claim 1, wherein the sectional area of the first portion of the via conductor in the direction parallel or substantially parallel to the one main surface of the insulating layer is smaller than the sectional area of the second portion of the via conductor in the direction parallel or substantially parallel to the one main surface of the insulating layer.

3. The radio frequency module according to claim 1, further comprising a second electronic component that is stacked on the first electronic component.

4. The radio frequency module according to claim 3, wherein the second electronic component is electrically connected to the first electronic component with the wiring line interposed therebetween.

5. The radio frequency module according to claim 1, wherein the first electronic component is a surface acoustic wave filter.

6. The radio frequency module according to claim 1, wherein the insulating layer is made of a resin.

7. The radio frequency module according to claim 3, wherein at least a portion of the first electronic component overlaps the second electronic component in a plan view from a direction perpendicular or substantially perpendicular to the one main surface.

8. The radio frequency module according to claim 1, wherein a dimension of the first portion in a direction perpendicular or substantially perpendicular to the one main surface of the insulating layer is shorter than a dimension of the second portion in the direction perpendicular or substantially perpendicular to the one main surface of the insulating layer.

9. The radio frequency module according to claim 1, wherein a center of gravity of the first portion is nearer than a center of gravity of the second portion to the first electronic component.

10. The radio frequency module according to claim 1, wherein the via conductor is made of Cu.

11. A method of manufacturing a radio frequency module, the method comprising:
    embedding a first electronic component in an insulating layer;
    forming a wiring line that is electrically connected to the first electronic component on one main surface of the insulating layer;
    forming a bump electrode on another main surface of the insulating layer that is opposite the one main surface of the insulating layer; and
    forming a via conductor that extends through the insulating layer and that is connected to the wiring line and the bump electrode; wherein
    the via conductor includes a first portion on a wiring line side and a second portion on a bump electrode side; and
    the via conductor is formed such that a sectional area of the first portion in a direction parallel or substantially parallel to the one main surface is smaller than a sectional area of the second portion in the direction parallel or substantially parallel to the one main surface.

12. The method of manufacturing the radio frequency module according to claim 11, wherein the via conductor includes Cu and is formed by an electroplating method.

13. The method of manufacturing the radio frequency module according to claim 11, the via conductor is formed such that the sectional area of the first portion of the via conductor in the direction parallel or substantially parallel to the one main surface of the insulating layer is smaller than the sectional area of the second portion of the via conductor in the direction parallel or substantially parallel to the one main surface of the insulating layer.

14. The method of manufacturing the radio frequency module according to claim 11, further comprising:
    stacking a second electronic component on the first electronic component.

15. The method of manufacturing the radio frequency module according to claim 14, wherein the second electronic component is electrically connected to the first electronic component with the wiring line interposed therebetween.

16. The method of manufacturing the radio frequency module according to claim 11, wherein the first electronic component is a surface acoustic wave filter.

17. The method of manufacturing the radio frequency module according to claim 11, wherein the insulating layer is formed of a resin.

18. The method of manufacturing the radio frequency module according to claim 14, wherein at least a portion of the first electronic component overlaps the second electronic component in a plan view from a direction perpendicular or substantially perpendicular to the one main surface.

19. The method of manufacturing the radio frequency module according to claim 11, wherein the via conductor is formed such that a dimension of the first portion in a direction perpendicular or substantially perpendicular to the one main surface of the insulating layer is shorter than a dimension of the second portion in the direction perpendicular or substantially perpendicular to the one main surface of the insulating layer.

20. The method of manufacturing the radio frequency module according to claim 11, wherein the via conductor formed such that a center of gravity of the first portion is nearer than a center of gravity of the second portion to the first electronic component.

* * * * *